(12) United States Patent
Azizi

(10) Patent No.: US 7,450,036 B2
(45) Date of Patent: Nov. 11, 2008

(54) SAMPLE RATE CONVERTER HAVING A ZERO-PHASE FILTER

(75) Inventor: Seyed Ali Azizi, Eningen (DE)

(73) Assignee: Harman Becker Automotive Systems GmbH, Karlsbad (DE)

(*) Notice: Subject to any disclaimer, the term of this patent is extended or adjusted under 35 U.S.C. 154(b) by 0 days.

(21) Appl. No.: 11/625,602

(22) Filed: Jan. 22, 2007

(65) Prior Publication Data

US 2007/0194955 A1 Aug. 23, 2007

Related U.S. Application Data

(63) Continuation of application No. 11/017,021, filed on Dec. 20, 2004, now Pat. No. 7,167,113.

(51) Int. Cl.
*H03M 7/00* (2006.01)

(52) U.S. Cl. .......................... 341/61; 341/143

(58) Field of Classification Search ............. 341/61, 341/143, 163
See application file for complete search history.

(56) References Cited

U.S. PATENT DOCUMENTS

| 4,750,180 | A | 6/1988 | Doyle | 714/762 |
|---|---|---|---|---|
| 5,481,568 | A | 1/1996 | Yada | 375/340 |
| 6,173,011 | B1 | 1/2001 | Rey et al. | 375/233 |
| 6,854,002 | B2 | 2/2005 | Conway et al. | 708/313 |
| 7,167,113 | B2 * | 1/2007 | Azizi | 341/61 |

OTHER PUBLICATIONS

Kormylo et al., "Two-pass recursive digital filters with zero phase shift," IEEE Trans. Acoust., Speech, Signal Processing, vol. ASSP-22, pp. 384-387, Oct. 1974.
R. Czarnanch, "Recursive processing by noncausal digital filters," IEEE Trans. Acoust., Speech, Signal Processing, vol. ASSP-30, No. 3, pp. 363-370, Jun. 1982.
Powell et al., "A Technique for realizing linear phase IIR filters," IEEE Trans. Acoust., Speech, Signal Processing, vol. ASSP-39, No. 11, pp. 242-243, Nov. 1991.
S.A. Azizi "Realization of linear Phase Sound Processing Filters Using Zero Phase IIR Filters," presented at the 102$^{nd}$ Convention of AES, Munich, Mar. 22-25, 1997.
S.A. Azizi "Performance Analysis of Linear Phase Audio Filters based on the Zero Phase Filtering Concept," presented at the 103$^{rd}$ Convention of AES, New York, Sep. 26-29, 1997.
P.P. Vaidyanathan: "Multirate Systems and Filter Banks," 1993. XP002280183, pp. 34-37.
Adams et al., "Theory and VLSI architectures for asynchronous sample-rate converters", Audio Engineering Society, vol. 41, No. 7/8, pp. 539-544, Jul. 1993.
Ramstad, "Digital methods for conversion between arbitrary sampling frequencies", IEEE, vol. 32, No. 3, pp. 577-591, Jun. 1984.
Proakis et al., "Digital signal processing: principles, algorithms, and applications", Prentice-Hall, 1996.

* cited by examiner

*Primary Examiner*—Peguy JeanPierre
(74) *Attorney, Agent, or Firm*—O'Shea Getz P.C.

(57) ABSTRACT

A sample rate converter for converting a digital input signal having a first sample rate into a digital output signal having a second sample rate, wherein the second sample rate is different from the first sample rate. The sample rate converter includes a digital interpolation filter receiving the input signal and comprising a digital zero-phase filter, and a digital polynom interpolator connected to the interpolation filter and providing the output signal.

18 Claims, 6 Drawing Sheets

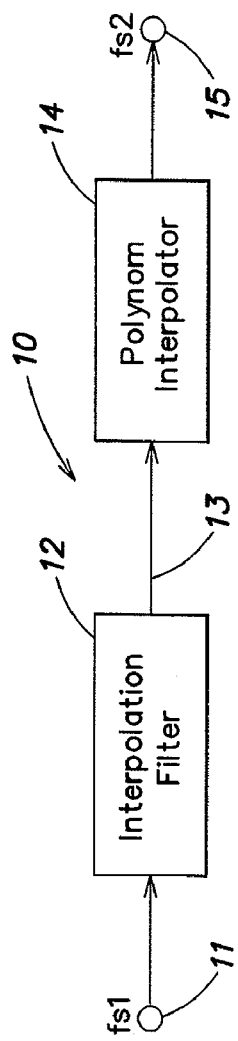
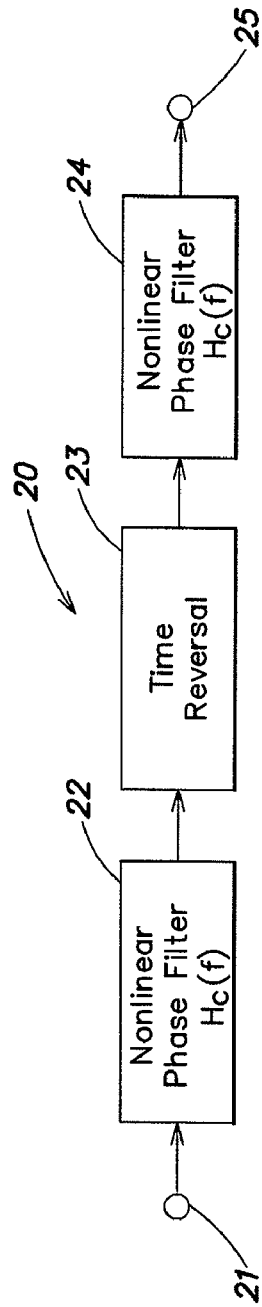
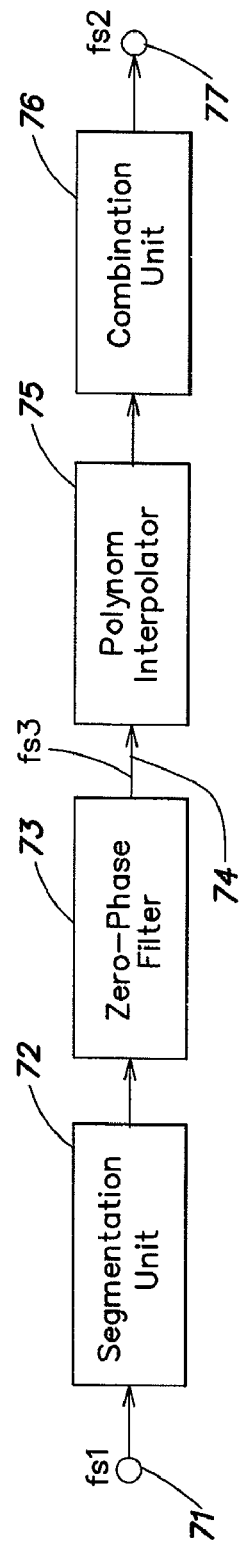
FIG. 1 (Prior Art)
FIG. 2
FIG. 7

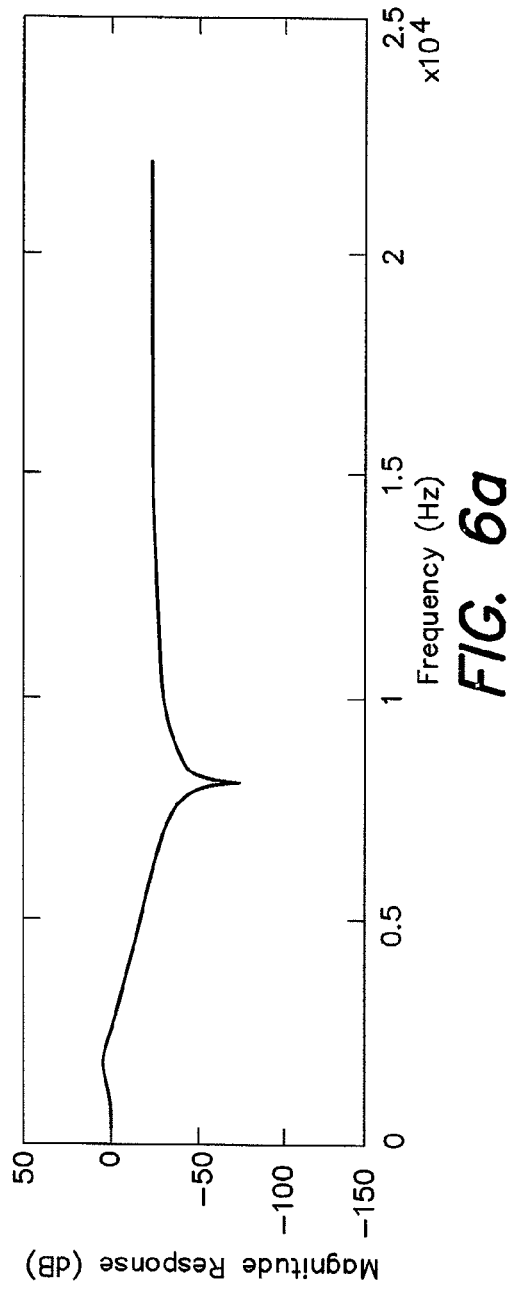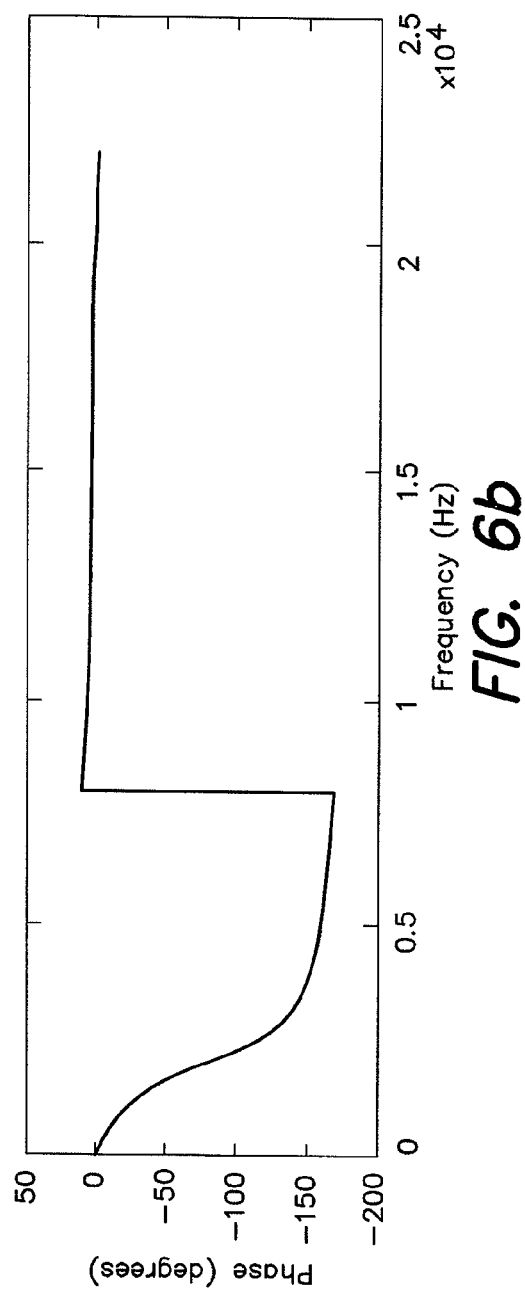
FIG. 6a
FIG. 6b

SAMPLE RATE CONVERTER HAVING A ZERO-PHASE FILTER

CLAIM OF PRIORITY

This application is a continuation of Ser. No. 11/017,021 filed Dec. 20, 2004 now U.S. Pat. No. 7,167,113.

FIELD OF THE INVENTION

The invention relates to a sample rate converter for converting a digital input signal having a first sample rate into a digital output signal having a second sample rate, where the second sample rate is different from the first sample rate.

RELATED ART

With many applications in the multimedia field, and in particular in the audio field, signals having different sample rates must be processed. For example, Digital Video Discs (DVDs) may have a sample rate of 48 kHz, 96 kHz or 192 kHz, while MP3 audio files may have a sample rate of 8 kHz, 16 kHz, or 32 kHz and audio signals transmitted by a MOST bus may have a 44.1 kHz sample rate. To deal with all these different sample rates sample rate converters are often used to convert these varying sample rates into a rate that is adequate for further processing.

As shown in FIG. 1, a sample rate converter 10 converts a digital input signal on a line 11 having a first sample rate $f_{S1}$ into a digital output signal on a line 15 having a second sample rate $f_{S2}$, different from the first sample rate $f_{S1}$. The sample rate converter 10 includes a digital interpolation filter 12 that receives the input signal on a line 11 and a digital polynom interpolator 14 connected to the interpolation filter 12 for transmitting an intermediate signal on a line 13, and providing the output signal on the line 15. The publication by R. Adams and T. Kwan entitled "*Theory and VLSI Architectures for Asynchronous Sample-Rate Converters*", J. Aud. Eng. Soc. Vol. 41, No. 7/8, 1993 July/August, p. 539-555 discloses different types of sample rate converters using different interpolation filters. The converters disclosed therein have in common that they either require a lot of memory space and/or a large processor capacity, or showing some instabilities or major phase nonlinearities.

Finite Impulse Response (FIR) filters offer high stability and linearity, however, a lot of memory space and processor operations are necessary to implement FIR filters. On the other hand, Infinite Impulse Response (IIR) filters are relatively easy to implement but tend to be instable and have a nonlinear-phase response.

It is an object of the present invention to overcome these drawbacks.

SUMMARY

A sample rate converter receives a digital input signal having a first sample rate, and processes the digital input signal to provide an output signal having a second sample rate. The sample rate converter includes a digital interpolation filter and a digital polynom interpolator, where the interpolation filter includes a digital zero-phase filter.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

DESCRIPTION OF THE DRAWING

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views.

FIG. 1 is a block diagram illustration of a sample rate converter;

FIG. 2 is a block diagram illustration of a zero-phase filter for use in an interpolation filter of a sample rate converter;

FIGS. 6A and 6B illustrate the frequency response of a causal biquad filter and of a fourth order linear-phase IIR filter using the biquad filter as its subfilters.

FIG. 7 is a block diagram illustration of an enhanced sample rate converter.

DETAILED DESCRIPTION

Figure 3:
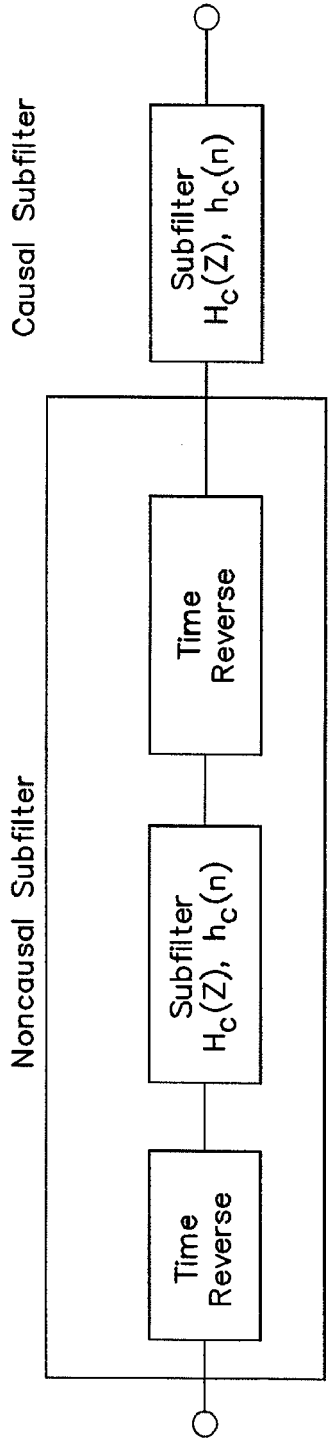
FIG. 3 is a block diagram illustration of an alternative embodiment zero-phase filter for use in an interpolation filter of a sample rate converter.

FIG. 1 is a block diagram illustration of a sample rate converter 10. The sample rate converter 10 includes a digital interpolation filter 12 and a digital polynom interpolator 14. Notably, the interpolation filter 12 includes a digital zero-phase filter, while the polynom interpolator 14 may comprise a zero-order hold unit.

FIG. 2 is a block diagram illustration of a zero-phase filter 20 for use in the interpolation filter 12. The zero-phase filter 20 receives an input signal on a line 21 with a sample rate fs1 and provides an output signal with a sample rate fs2. The zero-phase filter 20 comprises two identical IIR filters 22, 24 having a transfer function $H_c(f)$ wherein the second IIR filter 24 is connected to the first IIR filter 22 via a signal time reverser 23. The overall transfer function $H(f)$ of the zero-phase filter 20 can be expressed as:

$$H(f) = |H_c(f)|^2 \qquad \text{EQ. 1}$$

and in case there are any time delays created in the zero-phase filter 20

$$H(f) = |H_c(f)|^2 \cdot e^{j2\pi f} \qquad \text{EQ. 2}$$

The basic concept of noncausal zero phase filters is as follows.

To denote the impulse response $h_c(n)$ and the transfer function $H_c(z)$ of a causal IIR filter, a corresponding noncausal filter is created by building the mirror image of $h_c(n)$ denoted by $h_{nc}(n) = h_c(-n)$. The transfer function $H_{nc}(z)$ of the noncausal filter is obtained by $$H_{nc}(z) = H_c(z^{-1}) \qquad \text{EQ. 3}$$

By cascading the noncausal and the causal filter a new noncausal filter is obtained having the transfer function:

$$H(z)=H_{nc}(z)H_c(z)=H_c(z^{-1})H_c(z) \quad \text{EQ. 4}$$

According to EQ. 4 the transfer function of a zero phase IIR filter, derived from a stable causal filter, has poles inside and outside the unit circle. Its zeros may appear also on the unit circle. The poles inside the unit circle belong to $H_c(z)$, those outside the unit circle to $H_{nc}(z)$. The order of the noncausal filter $H(z)$ is twice the order of the causal filter $H_c(z)$.

The transfer function (i.e., the overall frequency response of the noncausal filter) $H(z)$ is as described in EQ. 4. As shown, the overall frequency response is a real function of frequency. Thus, the filter having a transfer function $H(z)$ has a phase response equal to zero which indicates, on one hand, that this filter creates no phase distortions and no group delay but, on the other hand, that it is a noncausal system and, therefore, cannot be realized in real time. Noncausal systems react, by definition, to an input signal in advance, that is before the stimulus is effective. Obviously, such systems are not realizable in real-time (i.e., on-line filtering is not possible). However, they can be applied to signals that have been recorded into a storage medium (i.e., off-line filtering).

From the overall transfer function $H(z)$ of a zero phase filter several implementation schemes can be derived. Two fundamental implementation schemes are the cascaded structure and the parallel structure. The cascaded structure corresponds directly to the parallel structure. A noncausal IIR subfilter is followed by a corresponding causal IIR subfilter or vice versa. The parallel scheme results from the partial fraction expansion of the overall transfer function $H(z)$.

For the non-real time realization of a zero-phase filter, the parallel structure is superior to the cascaded one with respect to implementation complexity. But in case the zero phase filtering concept is employed to realize linear-phase IIR filters in real time, the cascaded structure is preferred. Therefore, in the following the implementation will be focused on the cascaded structure wherein a noncausal filter is followed by a causal one, since this scheme will be applied later to realize linear-phase IIR filters. Further, it is assumed, that the input signal (sequence) is saved in a storage medium and can be sequentially read from there, wherein the subfilters are IIR filters.

According to EQ. 4, the implementation of a zero phase filter may include two steps:
1) Noncausal (backward) filtering: the input sequence is processed by a noncausal IIR subfilter $H_{nc}(z)$.
2) Causal (forward) filtering: the output sequence of the noncausal filter from step 1) is processed by a causal filter $H_c(z)$.

In case of a causal filter ($H_c(z)$, $h_c(n)$), the filtering operation (e.g., difference equation or convolution) is applied to the input sequence, starting from the first sample of the sequence, continuing forward to the following samples (forward or natural order filtering). In case of the noncausal filter:

$$H_{nc}(z)=H_c(z^{-1}), h_{nc}(n)=h_c(-n), \quad \text{EQ. 5}$$

the filtering operation is applied in the reversed direction. It starts from the last sample of the input sequence, continuing backward to its previous samples (backward or reversed order filtering). Alternatively, a noncausal filter maybe implemented by the following steps:
1) Time reversing of the input sequence x(n) and obtaining the sequence x(-n).
2) Applying the filtering operation $H_c(z)$, $h_c(n)$ to x(-n) in the natural order and getting the sequence v(n).
3) Time reversing of the filter output sequence and obtaining the final result y(n)=v(-n).

Figure 5A:
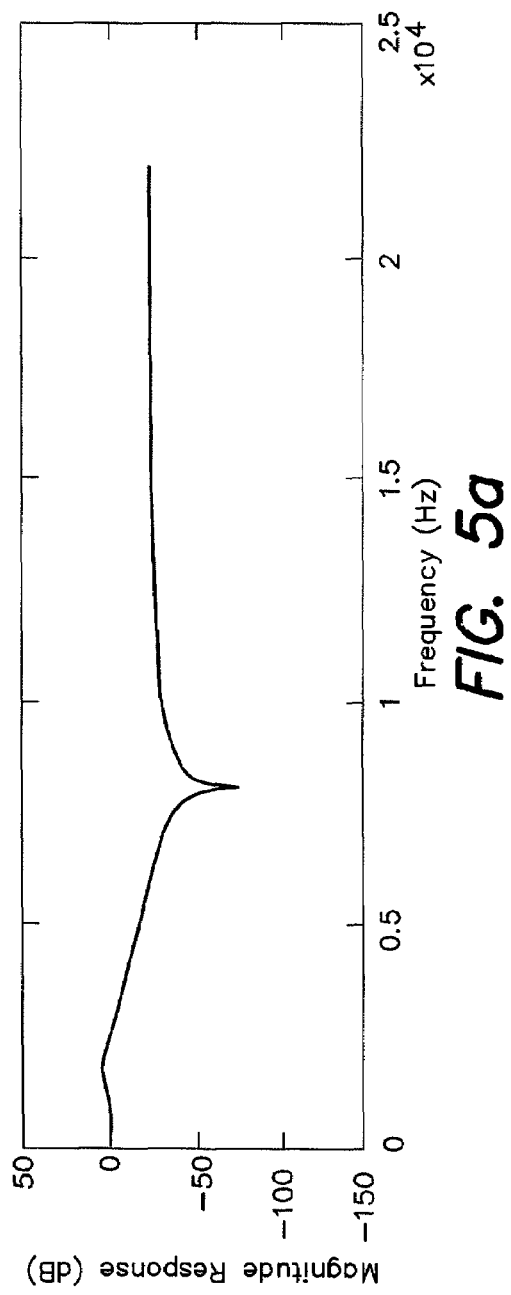
FIGS. 5A and 5B illustrate the amplitude and phase response respectively of a biquad filter and FIGS. 5C and 5D illustrate the magnitude and phase response respectively of a zero phase filter.
Figure 5B:
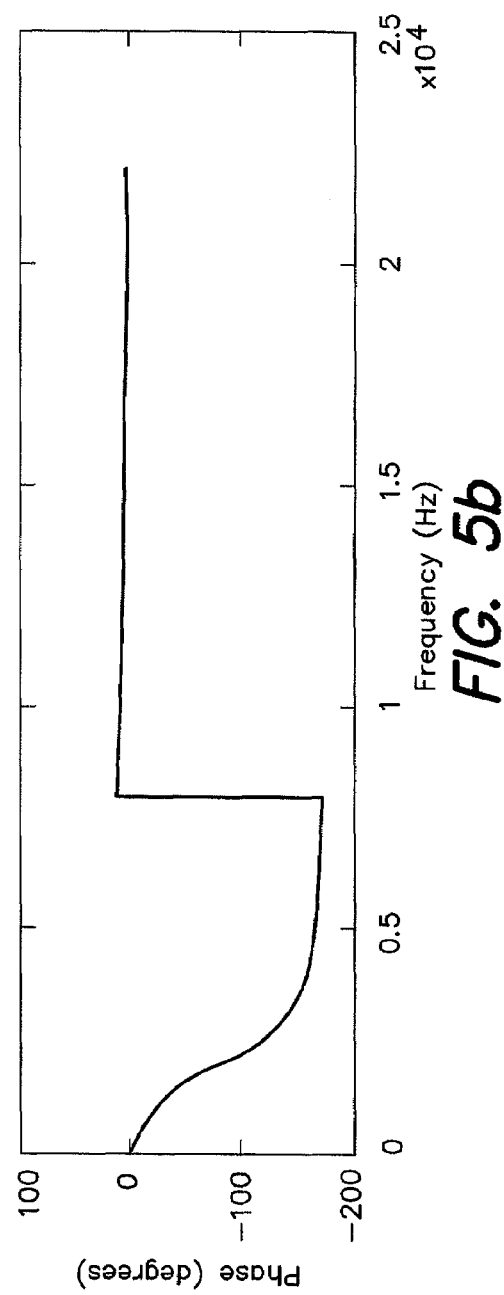
Figure 5C:
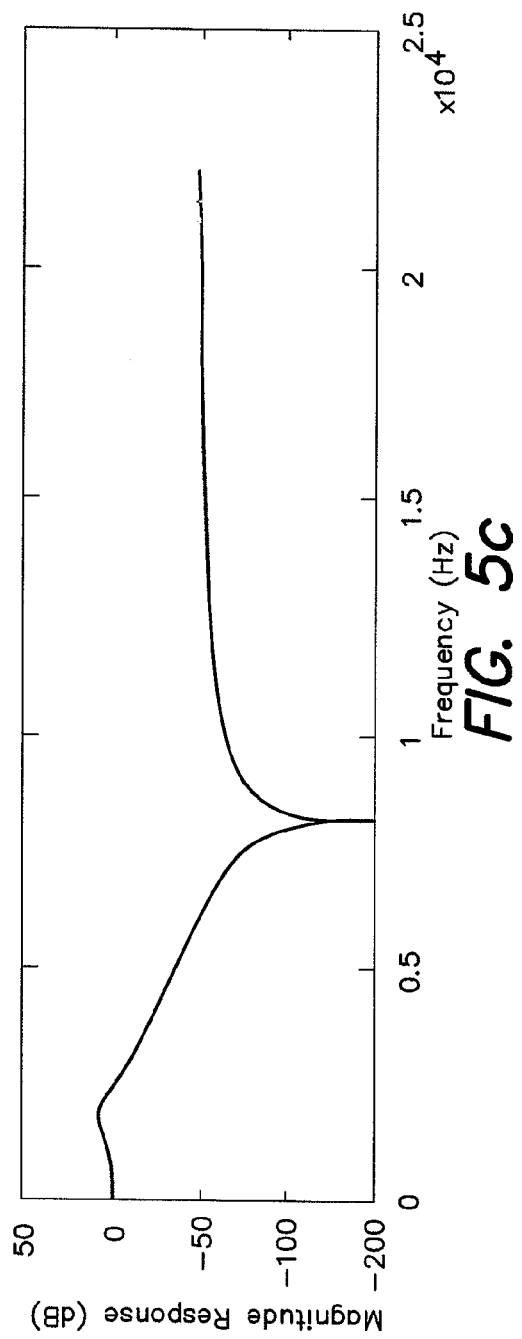
Figure 5D:
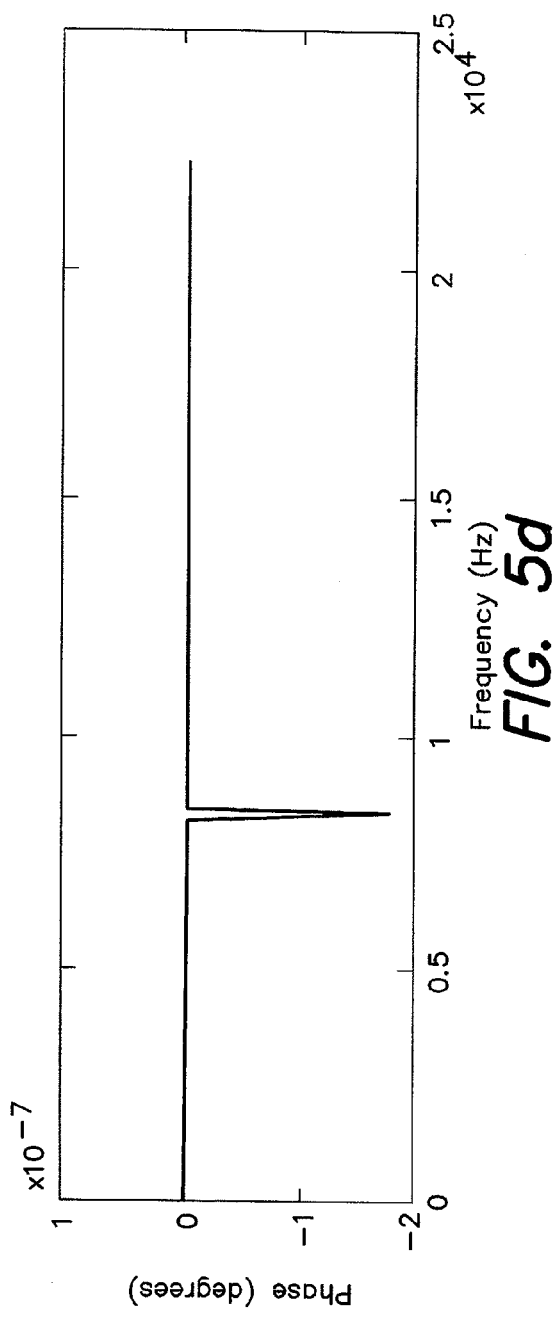

With respect to the foregoing, the principal operation of a zero phase IIR filter will be explained with reference to FIG. 3. The blocks denoted with $H_c(z)$ and $h_c(n)$ represent two identical causal IIR filters (first pass and second pass subfilter). The input signal x(n) is a time limited sequence, having nonzero samples only in a finite interval n=0, 1, . . . , N. First y, x(n) is time reversed: xr(n)=x(-n). Next, xr(n) is processed by the first pass causal subfilter, resulting in the sequence v(n)=$h_c$(n)·xr(n). Next, v(n) is time reversed: vr(n)=v(-n). Finally, vr(n) is processed by the second pass subfilter resulting in the desired zero phase filter output sequence y(n)=$h_c$(n)·vr(n). FIGS. 5A and 5B illustrate the amplitude and phase responses respectively of a biquad filter and FIGS. 5C and 5D illustrate the magnitude and phase responses respectively of a zero phase IIR filter employing the biquad filter as its subfilters. The overall phase response of the system is equal to zero, its overall magnitude response is, according to EQ. (1), equal to the square of the magnitude response of the causal IIR subfilter $H_c(z)$.

A fundamental problem must be taken into account while practically implementing a zero phase IIR filter. The response v(n) of the first pass IIR subfilter to its finite duration input xr(n) is infinite in time. This fact basically prohibits time reversing of v(n) as required by the next process step. Consequently, to build the time reverse (mirror image) of v(n), this sequence must be truncated, that is, the filtering process must be stopped at a certain time instant. The truncated sequence v(n) is then processed further as described above.

The truncation of v(n) generates errors in the output sequence of the zero phase filter, degrading its performance. Generally its magnitude response is more adversely affected by the truncation than its phase response. There are two ways of counteracting the truncation problem:
1) Increasing the first pass filtering duration obviously reduces the truncation errors. But this method is less desirable, because it rapidly increases the total computation capacity necessary.
2) The effects of truncating the first pass subfilter output sequence can be accounted for by appropriately setting the initial state values of the second pass subfilter.

According to EQ. 1, the frequency response of a zero phase IIR filter is equal to the square of the magnitude response of its causal IIR subfilter. Therefore, the design of a zero phase IIR filter can be redefined as a design problem for a causal IIR filter:
1. Define the tolerance scheme for the desired zero phase IIR filter H(z).
2. Derive a tolerance scheme for a causal IIR filter by forming the square root of the tolerance scheme from step 1).
3. Design a causal IIR filter $H_c(z)$ that satisfies the tolerance scheme from step 2) by using an (magnitude only) IIR filter design algorithm (for classical filters: Bessel, Butterworth, Elliptic etc. or an optimization filter design program). The phase response of the causal IIR filter is insignificant for the design objective.

Alternatively, zero phase IIR filters can be designed using an optimization design method applicable to this type of filters. A multiple criterion optimization design technique maybe applied to design noncausal filters of a general type including zero phase IIR filters. This design method accepts simultaneous constraints with respect to magnitude response and group delay. The design procedure computes the transfer function of the desired zero phase filter H(z). The required causal subfilter $H_c(z)$ can be obtained by combining the poles and zeros of $H(z)$ located inside the unit circle.

The described implementation technique for zero phase filters is not directly applicable to signals generated in real time, because real time signals are not known in whole length at processing time. Nevertheless, this technique can be successfully applied to real time signals, if one acquires a real time signal in the form of consecutive sections and processes each section by employing an adequate block processing technique, for instance, the overlap-add or the overlap-save method as described in the publication by J. J. Kormylo, V. K. Jain, entitled *"Two-pass recursive digital filters with zero phase shift"*, IEEE Trans. Acoust., Speech, Signal Processing, Vol. ASSP-22, pp. 384-387, October 1974; the publication by R. Czarnach, entitled *"Recursive processing by non-causal digital filters"*, IEEE Trans. Acoust., Speech, Signal Processing, Vol. ASSP-30, No. 3, pp. 363-370, June 1982; and the publication by S. R. Powell, P. M. Chau, entitled *"A Technique for realizing linear phase IIR filters"*, IEEE Trans. Acoust., Speech, Signal Processing, Vol. ASSP-39, No. 11, pp. 2425-243, November 1991. With respect to the cascaded structure according to EQ. 4, only the noncausal subfilter is necessarily realized using a sectioning technique. The causal subfilter may be implemented sample by sample.

The implementation technique that utilizes the overlap-add sectioning method will be briefly described. The input signal is continuously acquired in consecutive sections of the length L samples: $x_k(n)$, $k=0, 1, 2, \ldots$; $n=0, 1, \ldots, L-1$. Each section is considered as a time limited sequence and is processed by a zero phase filter as described above: first it is time reversed: $xr_k(n)=x_k(-n)$. Then $xr_k(n)$ is passed through a causal IIR subfilter $H_c(z)$, $h_c(n)$: $v_k(n)=h_c(n)\cdot xr_k(n)$. Next $v_k(n)$ is time reversed: $vr_k(n)=v_k(-n)$. The desired output sequence of the noncausal subfilter is obtained by superimposing the section responses $vr_k(n)$ in a proper way as described next. To find out the adequate way of combining the section responses, the following points should be taken into account:

a) Although $x_k(n)$ is finite, $v_k(n)$ and $vr_k(n)$ are obviously not, therefore, the section responses $vr_k(n)$ interfere with each other.

b) Because of noncausal processing, any section response can be interfered only by the following section responses, and not by the foregoing ones.

c) The interference intensity decreases with increasing section length L.

d) A sufficiently large section length $L_c$ may be estimated, with which the interferences with a certain section effected by all future sections except by the immediately following section are negligible. This critical section length can be determined from the impulse response $h_c(n)$ of the causal subfilter $H_c(z)$.

The design and implementation procedure for a linear-phase IIR filter based on the above mentioned points includes the steps of designing a causal subfilter $H_c(z)$, the squared magnitude response of which fulfills given specifications (see previous section); and computing the impulse response $h_c(n)$ of the subfilter and estimating the critical section length $L_c$.

The implementation scheme may be as follows:

1. Record a section of $L_c$ input samples $x_k(n)$, $n=0, 1, \ldots, L_c-1$ into an input buffer.

2. Time reverse $x_k(n)$: $xr_k(n)=x_k(-n)$.

3. Pass $xr_k(n)$ through the first pass subfilter $H_c(z)$, generating an output sequence of $2L_c$ samples: $v_k(n)$, $n=0, 1, \ldots, 2L_c-1$. The sequence $v_k(n)$ is divided into two segments: a leading segment $vl_k(n)$ and a trailing segment $vt_k(n)$, each of $L_c$ samples length: $v_k(n)=vl_k(n)+vt_k(n)$, $n=0, 1, \ldots, L_c-1$.

4. Build the intermediate section $w_k(n)$, $n=0, 1, \ldots, L_c-1$ by superimposing the trailing segment $vt_k(n)$ of the current sequence $v_k(n)$ and the leading segment $vl_{k-1}(n)$ of the previous sequence $v_{k-1}(n)$, read from a leading segment buffer: $w_k(n)=vl_{k-1}(n)+vt_k(n)$, $n=0, 1, \ldots, L_c-1$.

5. Store $vl_k(n)$ into the leading segment buffer.

6. Build the current output block $y_k(n)$ by time reversing $w_k(n)$: $Yk(n)=w_k(-n)$ and save it into an output buffer.

7. Pass the output section $y_k(n)$ through the second pass subfilter $H_c(z)$, to obtain the desired linear-phase filter output sequence.

The implementation scheme demands at least two double buffers of $L_c$ samples length for the input and the output section, and one buffer of $2L_c$ samples length for the intermediate sequence $v_k(n)$. The algorithm generates a delay of $L_c$ samples between the input and the output sequence, and, ideally a constant group delay of $L_c/2$ samples. For the ideal transfer function of the linear-phase IIR filter we obtain:

$$H(z)=H_c(z^{-1})H_c(z)z^{-L/2} \qquad \text{EQ. 6}$$

Figure 6C:
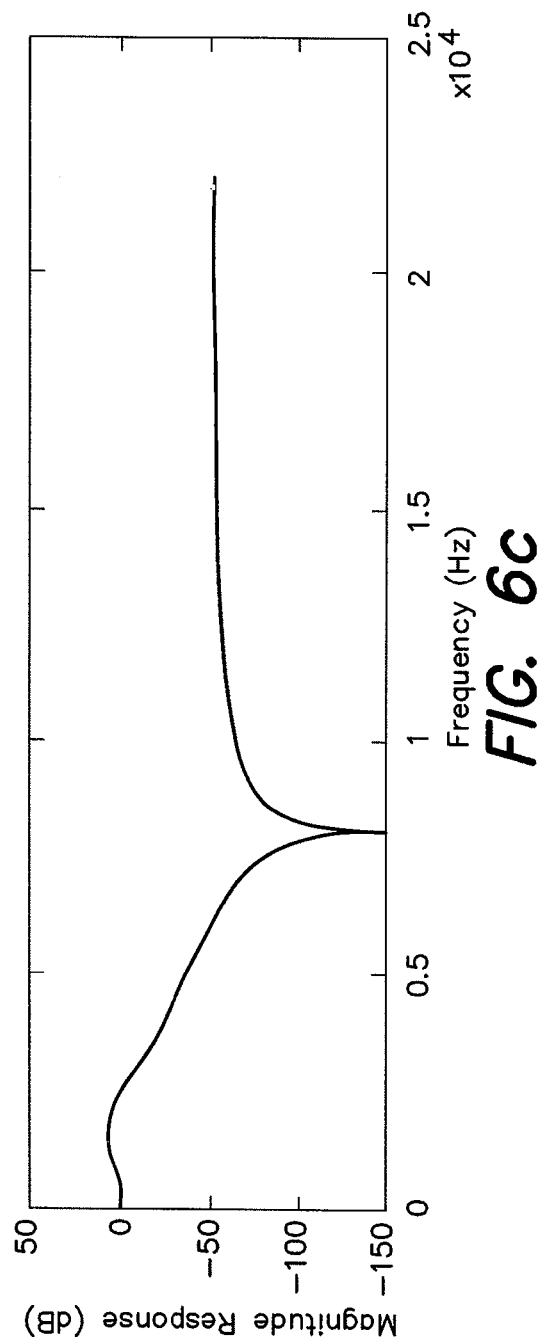
FIGS. 6C and 6D illustrate the frequency response of a causal biquad filter and of a fourth order linear-phase IIR filter using the biquad filter as its subfilters.
Figure 6D:
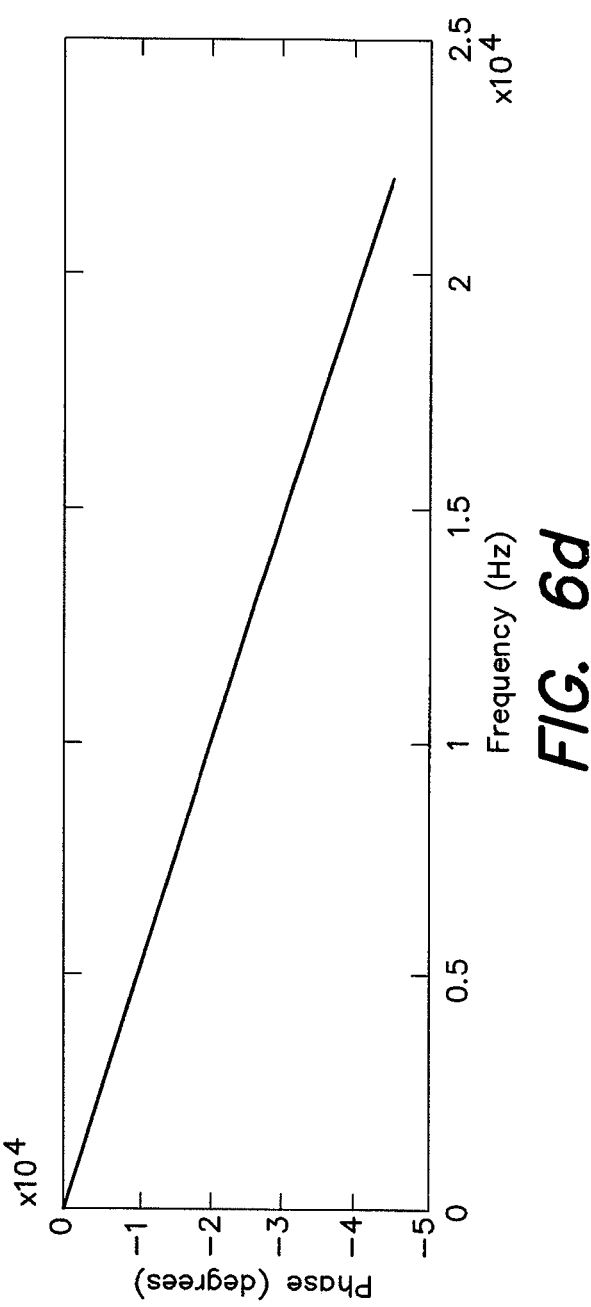

FIG. 6 illustrates the frequency responses of a causal biquad filter and of a fourth order linear-phase IIR filter using the biquad filter as its subfilters.

In the following, the basic concept of zero phase filters and that of linear phase IIR filters are described. Referring again to the basic operational concept of zero phase filters as shown in FIG. 3, a zero phase filter includes two cascaded filters (subfilters): a noncausal subfilter and a causal subfilter. The noncausal subfilter is implemented by utilizing a causal filter identical to the second causal filter in this way: the input signal is first time reversed in whole length, then passed through a causal filter ($H_c(z)$, $h_c(n)$). Hereafter the response of this filter, the intermediate response, is time reversed and passed through the second causal filter ($H_c(z)$,$h_c(n)$) to obtain the desired output signal. The time reversing of the intermediate response brings about the following implication: since the input signal is time limited, the intermediate response exhibits a final transient part following its initial transient and steady state part. In case of an IIR subfilter the final transient part decays more or less quickly towards zero but, theoretically it never reaches zero. Therefore, it must be truncated at a certain time instant, before it is time reversed. To properly take account of the final transient part, the duration of the truncated intermediate response must be sufficiently longer than the duration of the input signal.

The truncation step causes errors in the overall output signal that can be expressed as biases in magnitude and phase response. These deviations, however, can be completely eliminated by elaborately initializing the second subfilter before the truncated, time reversed intermediate response is passed through. As a conclusion, it is principally possible to realize bias free zero phase IIR filters. The ideal transfer function of the zero phase filter is given in EQ. 1.

Figure 4:
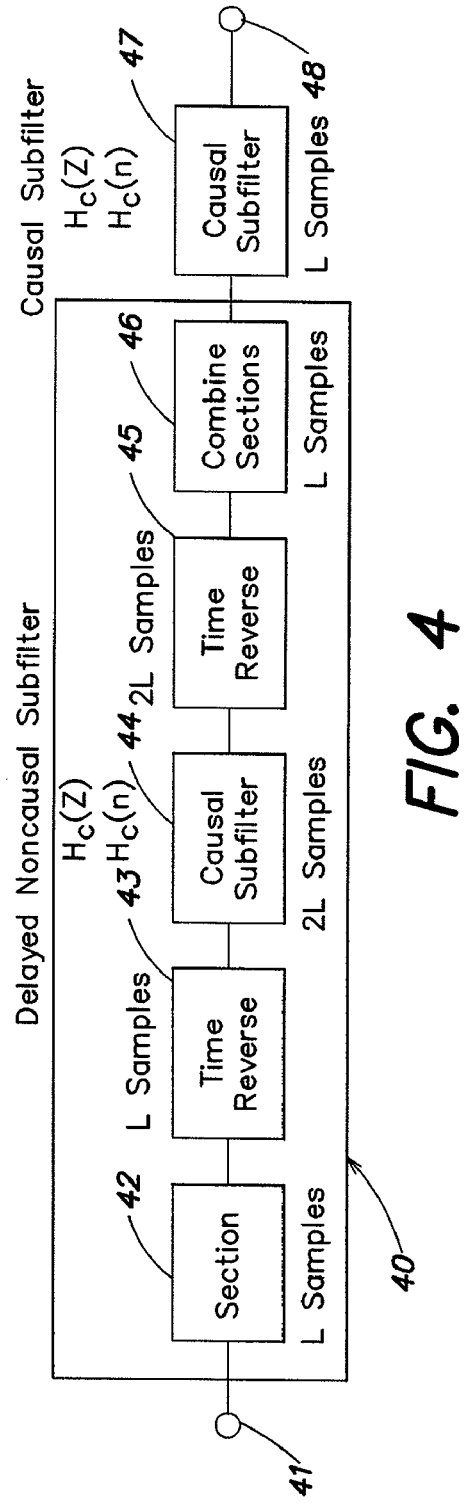
FIG. 4 is a block diagram illustration of an alternative zero-phase filter for use in an interpolation filter of a sample rate converter.

In the case of real time processing the input signal is assumed to be practically unlimited in time. As a consequence it cannot be time reversed entirely in one step as required by the zero phase filtering concept. Nevertheless, the concept can be modified for real time implementation as indicated in FIG. 4. The continuous input signal on the line 41 is segmented in a section unit 42 and recorded into blocks of L samples, and the zero-phase filtering concept is then applied to the individual recorded sections by a time reverser 43, a causal subfilter 44, and a time reverse 45 with combining of section 40 followed by a causal subfilter 47 to provide an output signal on the line 48. As known, block processing brings about a delay equal to or larger than the segment duration. By taking into account this delay, the noncausal subfilter demanded by the zero phase filtering can be conceived in this case as a "delayed noncausal subfilter 40" that is actually a causal one and therefore realizable in real time. Assuming that the subfilters 40, 47 used by the zero-phase concept are IIR filters, the application to the individual sections inevitably causes truncation errors which more or less deteriorate the overall filter performance.

The linear phase filtering algorithm may be described as a sequence of the following steps:

1) The input signal is sectioned into (continuous or overlapped) segments of length L.
2) Each individual segment is time reversed.
3) Each time reversed segment is passed through a first causal subfilter.
4) The resulting response to each input segment (intermediate response) is truncated at the length L; which must be sufficiently larger than L to keep the truncation errors low.
5) The truncated intermediate responses are superimposed according to the selected sectioning technique (overlap-add, overlap-save etc.) and passed consecutively through a second causal filter identical to the first one to obtain the overall output signal.

In case IIR filters are used as subfilters, the inevitable truncation of the intermediate responses of the delayed noncausal subfilter causes errors in the overall output signal that unfortunately can not be easily eliminated as in the case of zero phase filters. The strength of the errors, however, rapidly decreases with increasing segment length L. On the other hand, enlarging length L results in an increase in memory space necessary. Thus, finding out the optimum section length in a given application demands a trade-off between processing/accuracy on one side and memory space on the other side.

Truncating the intermediate responses forces the filter output signal to deviate from its ideal form that would be obtained without the truncation step. The power of the difference signal decreases with an increase of the input segment length L, and with an increase of the length L of the final transient parts of the truncated intermediate responses $L_t = L_i - L$. From both statements it is conclusive that the deviations diminish with enlarging the length $L_i$ of the intermediate responses.

From the practical point of view, it is more convenient to select $L_i$ as a multiple of L so that $L_i = nL$. Hence, to reduce the segmentation errors by enlarging $L_i$ one can keep n at a small value (e.g., n=2) and chose a sufficiently large value for L or vice versa. Assuming $L_i = 2L$, the intermediate responses are truncated at a length twice as long as the input segment length L. Thus there remains a single parameter L for optimization purposes. It has been asserted, that the strength of the segmentation errors depend on the section length L: the larger L, the weaker the errors, but on the other side the higher the storage costs. As a result, there arises a demand for an analytical relation between the input segment length and the power of the segmentation error, which allows finding at least an estimate for the minimum section length $L_c$ (critical section length) that would force the segmentation errors to fall under a desired level.

To approximate the strength of the sectioning error as a function of input segment length L, and to estimate the critical segment length $L_c$, $h_{nc}(n)$ denotes the impulse response of the noncausal subfilter (disregarding any delays caused by the block processing) and $h_c(n)$ denotes that of the causal subfilter with $h_{nc}(n) = h_c(-n)$ and $h_{nc}(n) = 0$ for n>0. The segmentation of the input signal can be expressed as:

$$x(n) = \sum_{m=0}^{\infty} x_m(n) \qquad \text{EQ. 7}$$

with $x_m(n) = x(n)$, =0 and $mL \leq n \leq (m+1)L-1$, otherwise.

With EQ. (7), the ideal response of the noncausal subfilter (without truncation) is obtained as:

$$y_1(n) = \sum_{m=p}^{\infty} y_m(n) \qquad \text{EQ. 8}$$

with $$y_m(n) = \sum_{k=mL}^{(m+1)L-1} x_m(k) h_c(n-k)$$

n=pL+q,
p=0, 1, ..., ∞ (segment index)
q=0, 1, ..., L−1 (sample index inside each segment)

$y_m(n)$ denotes the intermediate response of the noncausal subfilter to the input segment $x_m n$. Due to the fact that the index m in EQ. 8 runs from p to infinity, this relation describes the noncausal subfilter and $y_1(n)$ is identical to the filter output signal obtained without sectioning the input signal (i.e., with single sample processing).

In case the intermediate responses are truncated each at a length of $L_i = 2L$, the actual response of the noncausal subfilter can be expressed as:

$$y(n) = \sum_{m=p}^{p+1} \sum_{k=mL}^{(m+1)L-1} x_m(k) h_{cn}(n-k) \qquad \text{EQ. 9}$$

with n expressed as in EQ. 8. Basically EQ. 9 does not describe a linear and time invariant system. In practice, the nonlinearity and time invariance effects, however, are so weak that they can be modelled as random errors. For the deviation of the actual response from the ideal one, that is, for the segmentation error e(n)=y1(n)−y(n), it is obtained:

$$e(n) = \sum_{k=mL}^{(m+1)L-1} x_m(k) h_{cn}(n-k) \qquad \text{EQ. 10}$$

An enhanced sample rate converter is illustrated in FIG. 7. The sample rate converter includes a section unit 72 receiving an input signal on a line 71 with a sample rate $f_{S1}$. A zero-phase filter 73 is connected upstream to the section unit 72 providing an intermediate signal on a line 74 with a sample rate $f_{S3}$. The intermediate signal on the line 74 is fed into a polynom interpolator 75. A combination unit 76 is connected to the polynom interpolator 75 and provides an output signal on a line 77 having a sample rate $f_{S2}$. The sample rate $f_{S2}$ is different from the sample rate $f_{S1}$, wherein the sample rate $f_{S3}$ is higher than either the sample rate $f_{S1}$ and sample rate $f_{S2}$.

For further information regarding zero-phase filter reference is made to the publication by S. A. Azizi, entitled "*Realization of linear Phase Sound Processing Filters Using Zero*

*Phase IIR Filters"*, presented at the 102$^{nd}$ Convention of AES, Munich, 1997 Mar. 22-25, and the publication by S. A. Azizi, entitled *"Performance Analysis of Linear Phase Audio Filters based on the Zero Phase Filtering Concept"*, presented at the 103$^{rd}$ Convention of AES, New York, 1997 Sep. 26-29, both of which are incorporated herein by reference.

The above-mentioned systems may be implemented in microprocessors, signal processors, microcontrollers, computing devices, et cetera. The individual system components include in this case hardware components of the microprocessors, signal processors, microcontrollers, computing devices, et cetera. which are correspondingly implemented executable program instructions.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The illustrations have been discussed with reference to functional blocks identified as modules and components that are not intended to represent discrete structures and maybe combined or further sub-divided. In addition, while various embodiments of the invention have been described, it will be apparent to those of ordinary skill in the art that other embodiments and implementations are possible that are within the scope of this invention. Accordingly, the invention is not restricted except in light of the attached claims and their equivalents. is not restricted except in light of the attached claims and their equivalents.

What is claimed is:

1. A sample rate converter for converting a digital input signal having a first sample rate into a output signal having a second sample rate, where the second sample rate is different from the first sample rate, the sample rate converter comprising:
    a digital interpolation filter that includes a digital zero-phase filter, and receives the input signal and provides a digital interpolation filter output signal; and
    a digital polynom interpolator that receives the digital interpolation filter output signal and provides the output signal, where the polynom interpolator comprises a zero-order hold unit.

2. The sample rate converter of claim 1, where the digital zero-phase filter comprises:
    a first digital zero-linear-phase filter that receives the digital input signal and having a transfer function;
    a digital signal time reverser connected to the first digital zero linear-phase filter; and
    a second digital zero-linear-phase filter connected to the digital signal time reverser and having a transfer function identical to the transfer function of the first digital zero-linear-phase filter.

3. The sample rate converter of claim 1, where the first and second digital zero-linear-phase filters comprise infinite impulse response filters.

4. The sample rate converter of claim 3, where the digital zero-phase filter comprises a time delay.

5. The sample rate converter of claim 1, where
    the digital interpolation filter provides a digital intermediate signal having a sample rate higher than the sample rates of the digital input and output signals; and
    where the intermediate signal is supplied to the polynom interpolator.

6. The sample rate converter of claim 1, where
    the input signal is supplied via a segmenting unit to the interpolation filter; and
    a combining unit is connected to the polynom interpolator and providing the output signal.

7. The sample rate converter of claim 1, where the digital zero-phase filter comprises a non-causal subfilter connected with a causal subfilter.

8. The sample rate converter of claim 7, where the non-causal subfilter and the causal subfilter are connected in a cascade arrangement.

9. The sample rate converter of claim 7, where the non-causal subfilter comprises a delayed non-causal subfilter.

10. The sample rate converter of claim 7, where the non-causal subfilter comprises a first time reversal unit, an intermediate subfilter, and a second time reversal unit.

11. The sample rate converter of claim 10, where the intermediate subfilter comprises a causal subfilter.

12. A sample rate converter for converting a digital input signal having a first sample rate into a digital output signal having a second sample rate, where the second sample rate is different from the first sample rate, the sample rate converter comprising:
    interpolation means, comprising a digital zero-phase filter, for receiving the digital input signal and for providing an interpolation filter output signal; and
    a digital polynom interpolator that receives the interpolation filter output signal and provides the digital output signal, where the interpolation means comprises a zero-order hold unit.

13. The sample rate converter of claim 12, where the digital zero-phase filter comprises:
    a first digital zero-linear-phase filter that receives the digital input signal and having a transfer function;
    a digital signal time reverser responsive to the first digital zero-linear-phase filter; and
    a second digital zero-linear-phase filter responsive to the digital signal time reverser.

14. The sample rate converter of claim 12, where the first and second digital zero-linear-phase filters comprise infinite impulse response filters.

15. The sample rate converter of claim 12, further comprising:
    a segmentation unit that receives the digital input signal and provides the digital input signal to the interpolation means; and
    a combining unit connected to the polynom interpolator to provide the digital output signal.

16. The sample rate converter of claim 12, where the digital zero-phase filter comprises a non-causal subfilter connected with a causal subfilter.

17. A sample rate converter for converting a digital input signal having a first sample rate into a digital output signal having a second sample rate, where the second sample rate is different from the first sample rate, the sample rate converter comprising:
    a digital interpolation filter that comprises a digital zero-phase filter, and receives the digital input signal and provides a digital interpolation filter output signal;

a digital polynom interpolator that comprises a zero-order hold unit and receives the digital interpolation filter output signal and provides the digital output signal; and where the input signal is supplied via a segmenting unit to the interpolation filter.

18. A sample rate converter for converting a digital input signal having a first sample rate into a digital output signal having a second sample rate, where the second sample rate is different from the first sample rate, the sample rate converter comprising:

a first digital zero-linear-phase filter that receives the digital input signal and having a first transfer function;

a digital signal time reverser connected to the first digital zero-linear-phase filter;

a second digital zero-linear-phase filter connected to the digital signal time reverser and having a second transfer function dynamically equal to the first transfer function of the first digital zero-linear-phase filter, to provide a digital interpolation filter output signal; and a digital polynom interpolator that receives the digital interpolation filter output signal and provides the digital output signal.

\* \* \* \* \*

UNITED STATES PATENT AND TRADEMARK OFFICE
CERTIFICATE OF CORRECTION

| | |
|---|---|
| PATENT NO. | : 7,450,036 B2 |
| APPLICATION NO. | : 11/625602 |
| DATED | : November 11, 2008 |
| INVENTOR(S) | : Seyed Ali Azizi |

It is certified that error appears in the above-identified patent and that said Letters Patent is hereby corrected as shown below:

<u>Column 9</u>
Line 37-38, delete "is not restricted except in light of the attached claims and their equivalents."
Line 63, delete "claim 1," and insert --claim 2,--

Signed and Sealed this

Twenty-third Day of December, 2008

JON W. DUDAS
*Director of the United States Patent and Trademark Office*